(12) United States Patent
Cao et al.

(10) Patent No.: US 10,961,120 B2
(45) Date of Patent: *Mar. 30, 2021

(54) NANOPARTICLE STRUCTURE AND PROCESS FOR MANUFACTURE

(71) Applicant: INTERNATIONAL BUSINESS MACHINES CORPORATION, Armonk, NY (US)

(72) Inventors: Qing Cao, Yorktown Heights, NY (US); Kangguo Cheng, Schenectady, NY (US); Juntao Li, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/548,390

(22) Filed: Aug. 22, 2019

(65) Prior Publication Data
US 2019/0375632 A1 Dec. 12, 2019

Related U.S. Application Data

(63) Continuation of application No. 15/407,432, filed on Jan. 17, 2017, now Pat. No. 10,544,042.

(51) Int. Cl.
*B82Y 15/00* (2011.01)
*B82Y 40/00* (2011.01)
(Continued)

(52) U.S. Cl.
CPC .............. *B82Y 40/00* (2013.01); *C09K 11/66* (2013.01); *H01L 29/0665* (2013.01); *B82Y 10/00* (2013.01); *B82Y 15/00* (2013.01); *B82Y 20/00* (2013.01); *H01L 29/66227* (2013.01); *H01L 29/66439* (2013.01); *H01L 29/66977* (2013.01);
(Continued)

(58) Field of Classification Search
CPC ......... B82Y 40/00; B82Y 15/00; B82Y 15/20; H01L 29/0665; H01L 29/66075; H01L 21/2256; C09K 11/59; C09K 11/66
See application file for complete search history.

(56) References Cited

U.S. PATENT DOCUMENTS 6,918,946 B2 * 7/2005 Korgel .................. B82Y 10/00
75/362
7,722,953 B2 5/2010 Korgel et al.
(Continued)

OTHER PUBLICATIONS

List of IBM Patents or Patent Applications Treated as Related dated Aug. 22, 2019, 2 pages.
(Continued)

*Primary Examiner* — Cam N. Nguyen
(74) *Attorney, Agent, or Firm* — Tutunjian & Bitetto, P.C.; Randall Bluestone

(57) ABSTRACT

A method for forming nanoparticles includes forming a stack of alternating layers including a first material disposed between a second material. The stack of alternating layers is patterned to form pillars. A dielectric layer is conformally deposited over the pillars. The pillars are annealed in an oxygen environment to modify a shape of the first material of the alternating layers. The dielectric layer and the second material are etched selectively to the first material to form nanoparticles from the first material.

13 Claims, 9 Drawing Sheets

(51) Int. Cl.
    *H01L 29/06*       (2006.01)
    *H01L 29/66*       (2006.01)
    *H01L 21/22*       (2006.01)
    *C09K 11/59*       (2006.01)
    *C09K 11/66*       (2006.01)
    *B82Y 20/00*       (2011.01)
    *B82Y 10/00*       (2011.01)

(52) U.S. Cl.
    CPC ........ *Y10S 977/773* (2013.01); *Y10S 977/888* (2013.01); *Y10S 977/92* (2013.01); *Y10S 977/932* (2013.01)

(56) References Cited

U.S. PATENT DOCUMENTS

| | | | |
|---|---|---|---|
| 7,759,257 | B2 | 7/2010 | Linden |
| 8,084,101 | B2 | 12/2011 | Das |
| 8,241,922 | B2 | 8/2012 | Murphy et al. |
| 8,535,512 | B2 | 9/2013 | Walavalkar et al. |
| 8,618,595 | B2* | 12/2013 | Korgel ................ A61B 5/0059 257/315 |
| 8,767,282 | B2 | 7/2014 | Hashimura et al. |
| 8,937,294 | B2* | 1/2015 | Shim ................ H01L 31/0296 257/12 |
| 8,958,070 | B2 | 2/2015 | Wang |
| 9,230,987 | B2 | 1/2016 | Pachamuthu et al. |
| 9,249,481 | B2 | 2/2016 | Kwon et al. |
| 9,330,910 | B2 | 5/2016 | Chen et al. |
| 9,449,982 | B2 | 9/2016 | Lu et al. |
| 9,515,079 | B2 | 12/2016 | Koka et al. |
| 9,583,500 | B2 | 2/2017 | Pachamuthu et al. |
| 9,601,502 | B2 | 3/2017 | Sano et al. |
| 9,659,955 | B1 | 5/2017 | Sharangpani et al. |
| 9,716,105 | B1 | 7/2017 | Tsutsumi |
| 2007/0258889 | A1 | 11/2007 | Douglas et al. |
| 2010/0003291 | A1 | 1/2010 | Rothrock |
| 2010/0021985 | A1 | 1/2010 | Mason |
| 2012/0167262 | A1* | 6/2012 | Mirkin ................ B81C 1/00111 850/59 |
| 2014/0011013 | A1 | 1/2014 | Jin et al. |
| 2014/0191236 | A1* | 7/2014 | Nuzzo .................... H01L 29/04 257/49 |
| 2014/0287264 | A1* | 9/2014 | Tenne .................... C01G 19/00 428/699 |
| 2016/0126381 | A1 | 5/2016 | Wang et al. |
| 2018/0086885 | A1 | 3/2018 | Karim et al. |

OTHER PUBLICATIONS

Naik, G.V. et al., "Alternative Plasmonic Materials: Beyond Gold and Silver" Advanced Materials (May 2013) pp. 3264-3294, vol. 25.

* cited by examiner

NANOPARTICLE STRUCTURE AND PROCESS FOR MANUFACTURE

BACKGROUND

Technical Field

The present invention generally relates to nanoparticles and methods for fabrication, and more particularly to nanoparticles having reliably controlled dimensions and methods for forming the same.

Description of the Related Art

Chemical processing and synthesis of high-performance technological components, such as nanoparticles, often requires the use of high-purity and uniform materials. In powders and other condensed materials, different particle sizes often lead to non-uniform packing morphologies that result in packing density variations in the powder or condensed material. In addition, any fluctuations in packing density can result in inhomogeneous densification or other issues.

Nanoparticles can be used for a variety of applications such as biolabeling (e.g., fluorescent biological labels), drug delivery/targeting, slurries, etc. These and other applications are best served using nanoparticles with uniform shape and size.

SUMMARY

In accordance with an embodiment of the present invention, a nanoparticle includes a geometric configuration having a plurality sides and a center. Each side includes a curved shape forming a divot and forming edges as adjacent sides meet. The edges extending into sharp tips at a furthest distance from the center.

A method for forming nanoparticles includes forming a stack of alternating layers including a first material disposed between a second material. The stack of alternating layers is patterned to form pillars. A dielectric layer is conformally deposited over the pillars. The pillars are annealed in an oxygen environment to modify a shape of the first material of the alternating layers. The dielectric layer and the second material are etched selectively to the first material to form nanoparticles from the first material.

Another method for forming nanoparticles includes forming a stack of alternating layers on a substrate including SiGe layers disposed between Si material; patterning the stack of alternating layers to form pillars having side dimensions; conformally depositing an oxide layer over the pillars; thermally annealing the pillars in an oxygen environment to modify a shape of the SiGe layers; and wet etching the dielectric layer and the Si material selective to the SiGe layers to form SiGe nanoparticles.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
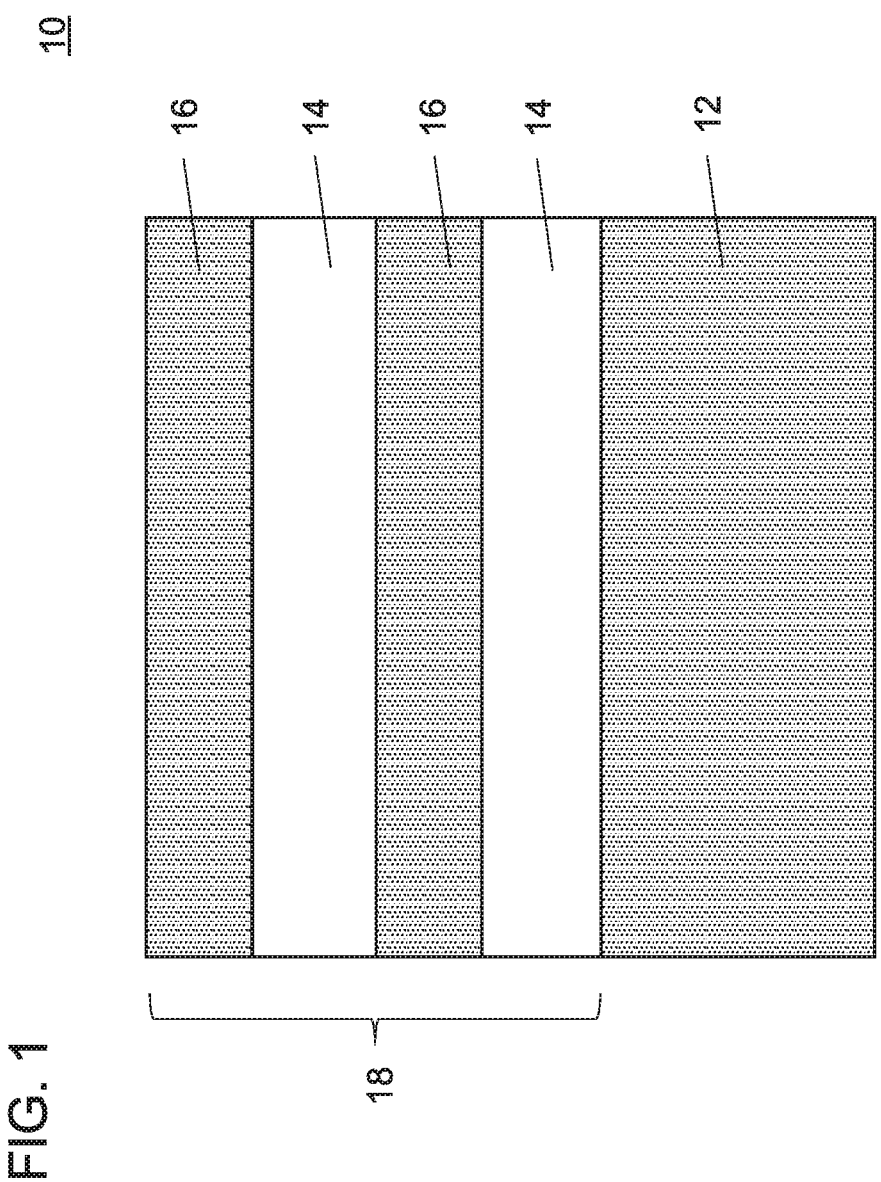
FIG. 1 is a cross-sectional view showing a stack of alternating layers formed on a substrate in accordance with an embodiment of the present invention.

Embodiments of the present invention include structures and methods for forming nanoparticles with controllable shape and size. Nanoparticles are formed with various controlled shapes and sizes, which conventional lithographic methods cannot achieve. By tuning oxidation and doping conditions, insulator, semiconductor or metallic nanoparticles can be formed, which are released from a substrate. The shape can also be controlled by tuning oxidation conditions.

In useful embodiments, a nanoparticle or nanoparticles are formed with a geometric configuration having a plurality sides and a center. Each side includes a curved shape forming a divot and forming edges as adjacent sides meet. The edges extend into sharp tips at a furthest distance from the center.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a semiconductor device 10 is shown in accordance with one embodiment. The device 10 includes a substrate 12 having multiple layers formed thereon. The substrate 12 can include any suitable substrate structure, e.g., a bulk semiconductor, a semiconductor-on-insulator (SOI) substrate, etc. In one example, the substrate 12 can include a silicon-containing material. Illustrative examples of Si-containing materials suitable for the substrate 12 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The substrate 12 is or includes a monocrystalline structure suitable for epitaxial growth or additional layers thereon. In one particularly useful embodiment, the substrate 12 includes a monocrystalline surface upon which a stack 18 of layers can be grown.

The stack 18 of layers includes alternating layers. The alternating layers can include SiGe layers 14 and Si layers 16. While four layers are illustratively depicted in stack 18, it should be understood that any number of layers can be employed. The greater the number of layers, the more nanoparticles will be formed per process sequence. The alternating layers of stack 18 are preferably formed using an epitaxial growth process.

Epitaxial growth can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE), etc. Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable processes. When SiGe is epitaxially grown, the SiGe may have germanium content in the range of 5% to 80%, or preferably between 20% and 60%.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface.

Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on a semiconductor surface, and generally do not deposit material on exposed surfaces, such as silicon dioxide or silicon nitride surfaces.

The thickness of the grown layers and, in particular, the layers 14 are controlled to control the size (and shape) of the nanoparticles to be formed. Thicker layers 14 result in larger nanoparticles. In one example, the thickness of layers 14 can be between about 1 nm to about 100 nm. Other dimensions can also be employed.

Layers 14 can be doped with additional dopants. In one embodiment, the layers 14 are formed using in situ doping, an ion implantation process, plasma doping, gas phase diffusion, diffusion from a doped oxide or a combination thereof. The conductivity type of the layers 14 can be n or p and include different concentrations depending on the application(s).

Figure 2:
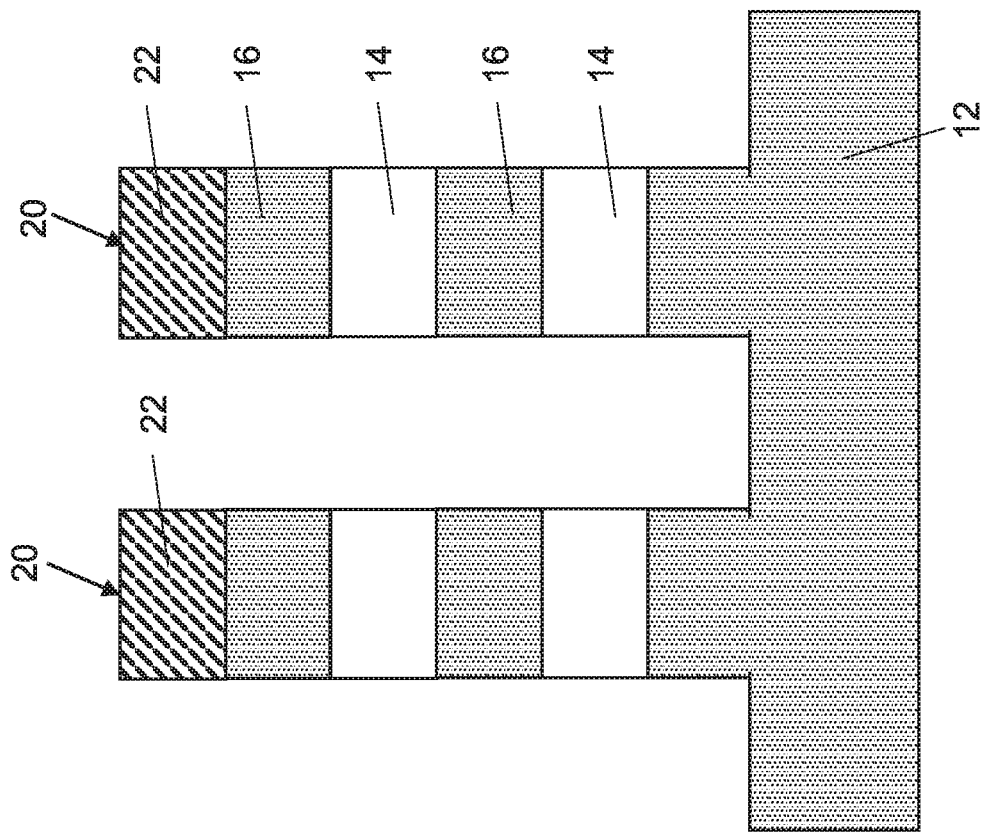
FIG. 2 is a cross-sectional view showing pillars patterned and etched into the stack of alternating layers of FIG. 1 in accordance with an embodiment of the present invention.

Referring FIG. 2, the stack 18 of layers is patterned to form a plurality of pillars 20. The patterning can be carried out using lithography, sidewall image transfer (SIT) or other patterning process. In particularly useful embodiments, SIT processing is performed to achieve the desired dimensions of the pillars 20.

More specifically, in one example of a SIT method, a photoresist mandrel is first formed on a surface of the semiconductor material (stack 18) of the substrate 12. The photoresist mandrel may be formed using deposition, patterning and development processes. Thereafter, a low-pressure chemical vapor (isotropic) deposition (CVD) provides a dielectric profile on the sidewalls of the photoresist mandrel. The photoresist mandrel may then be removed. For example, the photoresist mandrel can be removed using a chemical strip or selective etching. This process can be repeated as is known to achieve smaller dimensioned mandrels and therefore smaller sidewalls, as needed.

Following removal of the photoresist mandrel, the dielectric profile (e.g., sidewalls or spacers 22) remains to provide an etch mask. The semiconductor material (stack 18 and substrate 12) is then etched using the dielectric profile as an etch mask to provide the fin structures 15. The etch process for forming the pillars 20 may be an anisotropic etch, such as reactive ion etching (RIE). The RIE process can continue (overetch) into the substrate 12 to approximately a same thickness as layers 16 to achieve similar dimensions of the lower nanoparticles to be formed.

Figure 3:
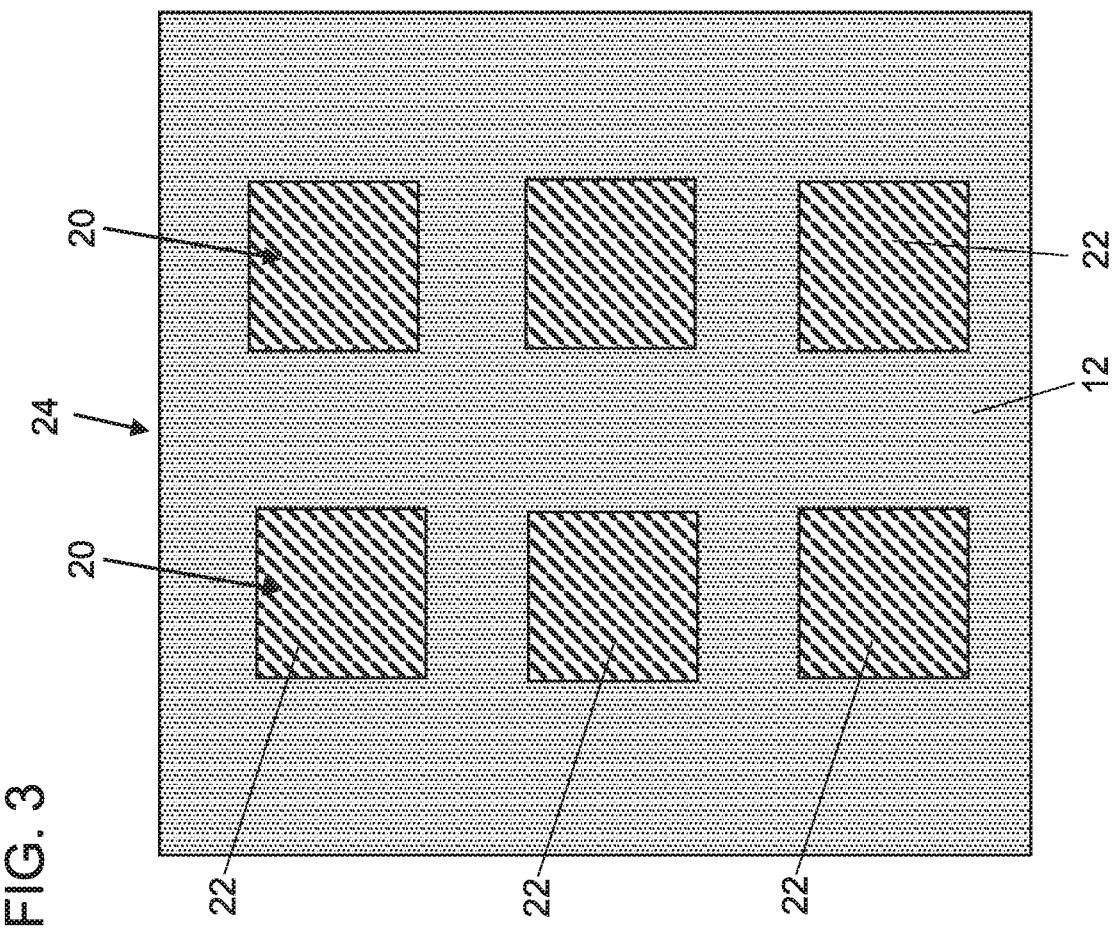
FIG. 3 is a top view showing the pillars of FIG. 2 patterned and etched into the stack of alternating layers in accordance with an embodiment of the present invention.

Referring to FIG. 3, a top view of the pillars 20 is illustratively shown. The pillars 20 are patterned to form a pillar array 24 on the substrate 12 (e.g., by SIT patterning). The pillar array 24 can include pillars with different cross-sectional shapes, e.g., square shapes, rectangular shapes, circular shapes, oval shapes, polygonal shapes, triangular shapes, etc.

Figure 4:
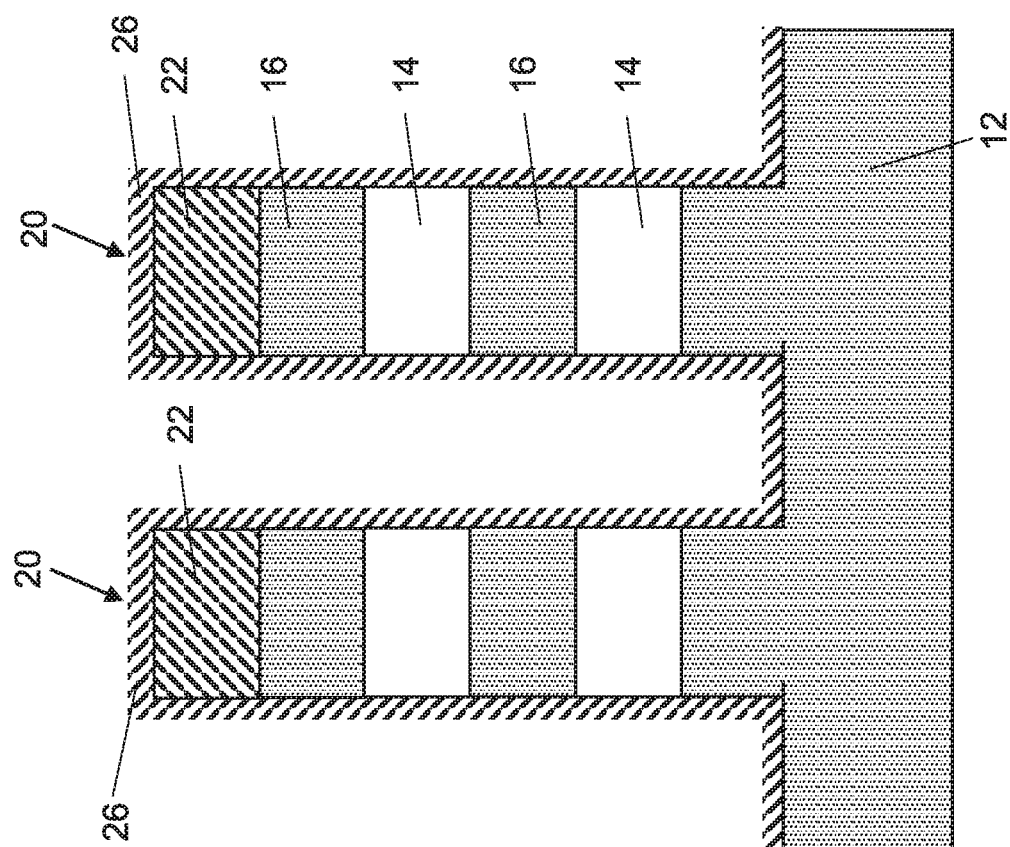
FIG. 4 is a cross-sectional view showing a dielectric layer conformally formed on the pillars of FIG. 3 in accordance with an embodiment of the present invention.

Referring to FIG. 4, the pillars 20 have a dielectric layer 26 conformally formed thereon. The dielectric layer 26 can include a silicon oxide, although other oxide layers or materials can be employed. The dielectric layer 26 provides oxygen in contact with layers 14 to permit oxygen diffusion from an external source such that the oxygen will react with the layers 14 as will be later described.

Figure 5:
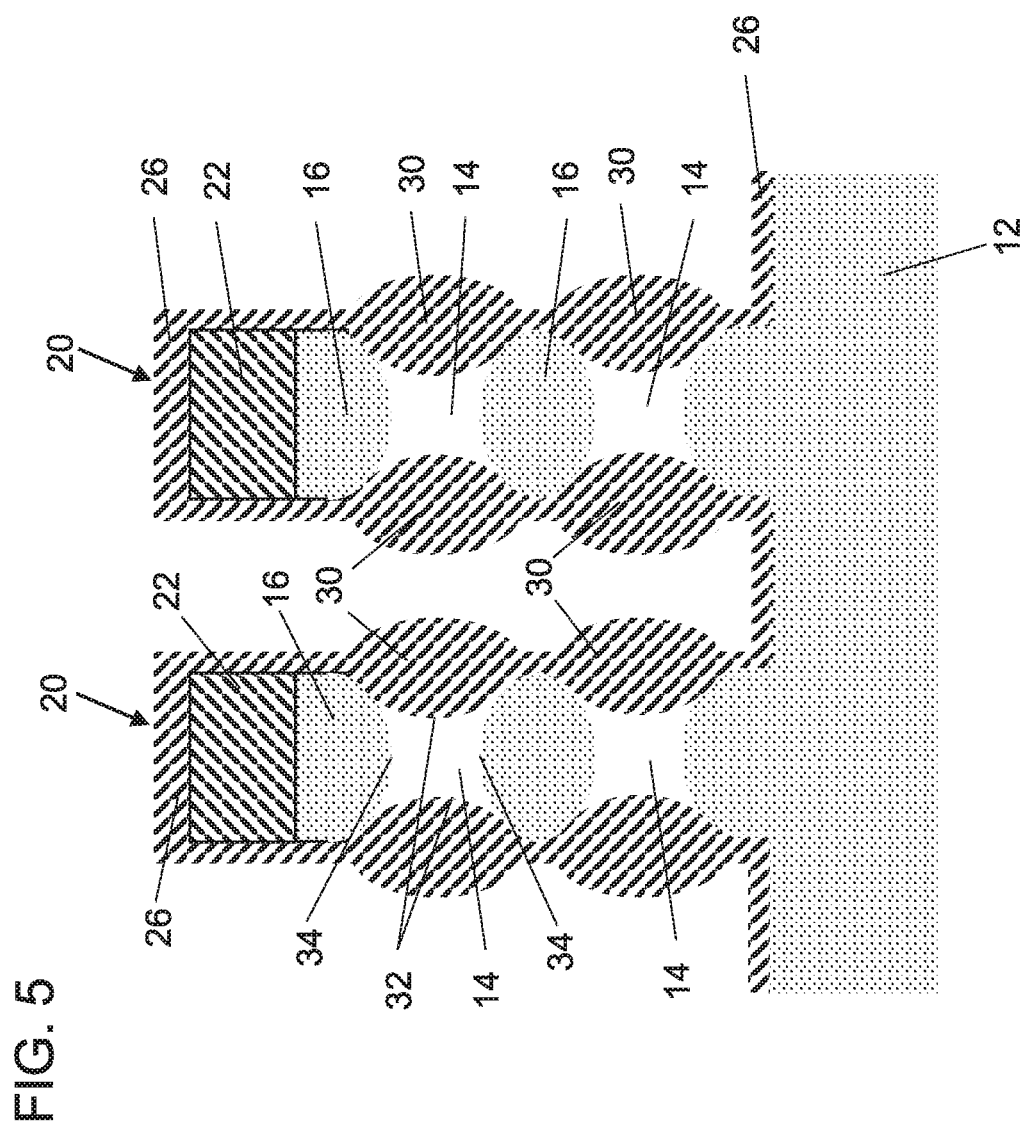
FIG. 5 is a cross-sectional view taken at section line X-X' of FIG. 6 showing the pillars oxidized to form oxidized regions that impact the shape of SiGe layers of the alternating layers in accordance with an embodiment of the present invention.

Referring to FIG. 5, a thermal anneal process is performed in an oxygen environment. The thermal anneal process can be at elevated temperatures in the range of approximately about 800° C. to about 1200° C. for a few seconds to up to an hour, although other times may be employed depending on the temperature and the dimensions of the nanoparticles to be formed. In another embodiment, the anneal process may be at a temperature ranging from about 1000° C. to 1150° C. The anneal process may be provided by at least one of a rapid thermal anneal (RTA) process, a laser-based anneal process, a flashlight-based anneal process, etc. or combinations thereof.

The thermal anneal in oxygen (oxidation) oxidizes the SiGe of layers 14 faster than Si of layers 16. This forms oxide regions 30 and provides arcuate shapes 32 on lateral sides of the layers or regions 14. The oxidation condition (pressure, temperature, etc.) can be tuned to modify the dimensions and shapes on the regions 30. In addition, the thermal anneal enhances Ge diffusion (e.g., interface enhanced diffusion) at the oxide/semiconductor interfaces between the Si of layers 16 and the oxide regions 30. This forms arcuate shapes 34 at tops, bottoms and/or sides of the layers or regions 14. Since, SiGe is oxidized faster than Si, and Ge diffusion is faster along the interface, star shaped regions form from layers 14.

Figure 6:
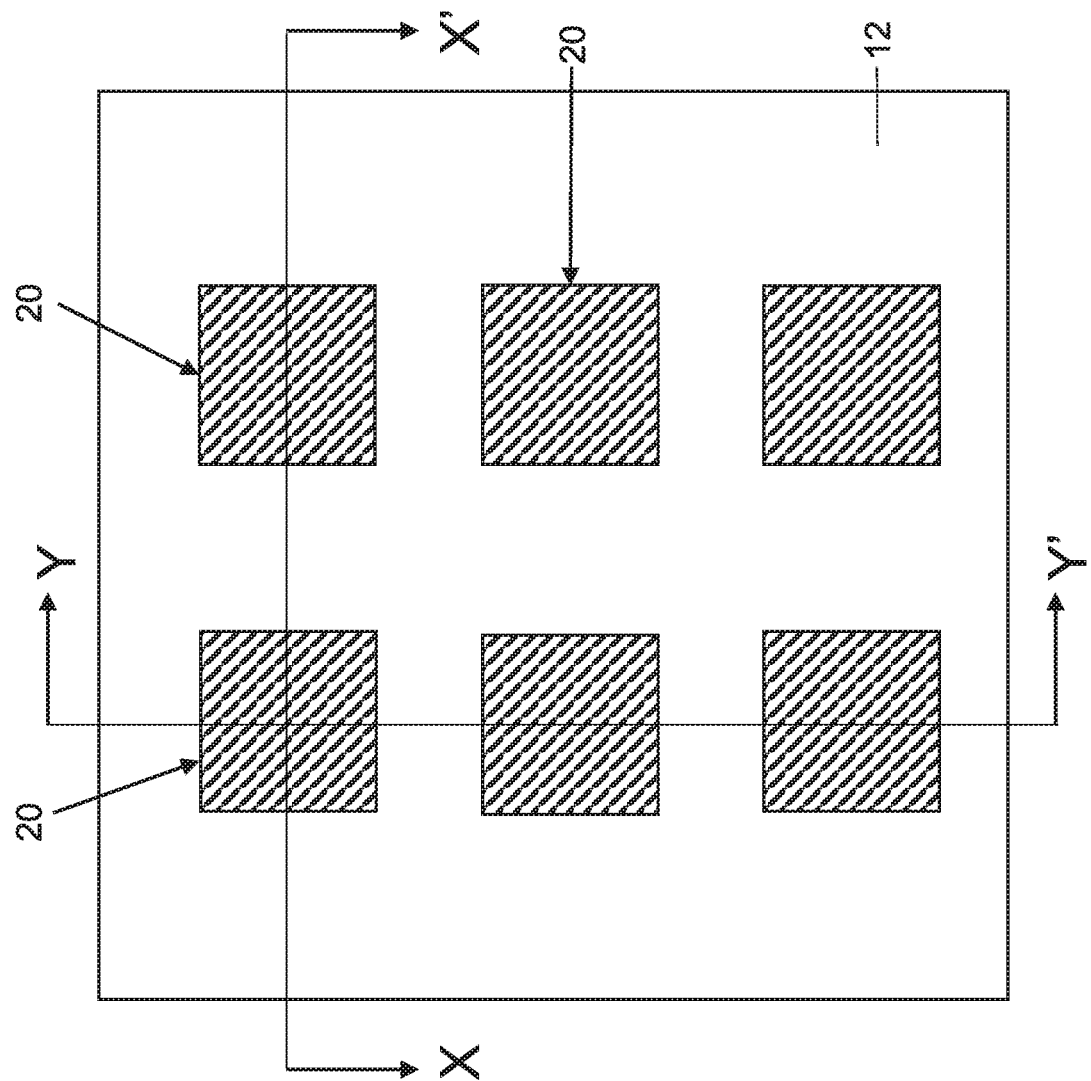
FIG. 6 is a top view showing the pillars with section lines X-X' and Y-Y' in accordance with an embodiment of the present invention.
Figure 7:
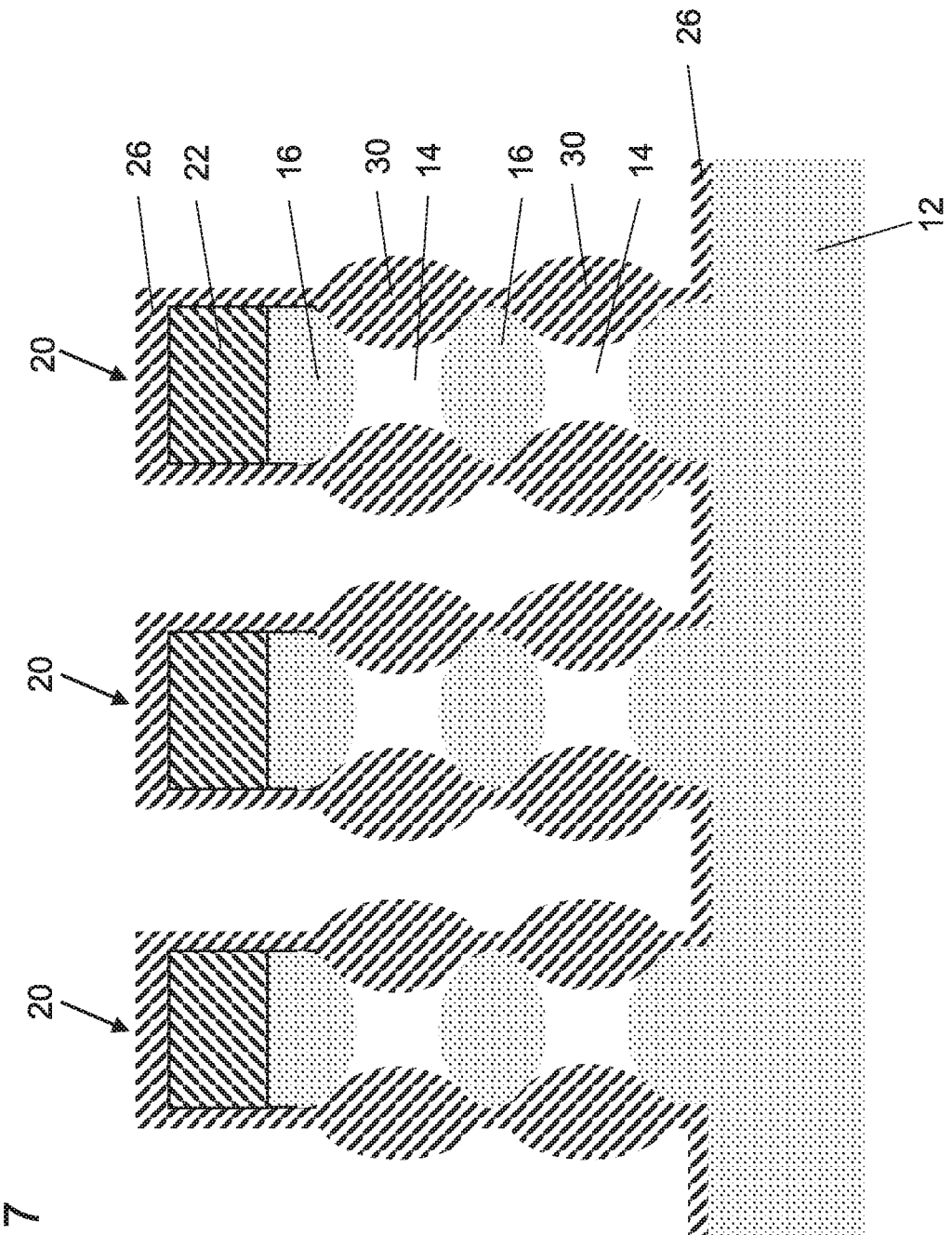
FIG. 7 is a cross-sectional view taken at section line Y-Y' of FIG. 6 showing the pillars oxidized to form oxidized regions having the same dimensions as in FIG. 5 due to the square patterned shapes in accordance with an embodiment of the present invention.

Referring to FIG. 6, a top view of the pillars 20 is illustratively shown with the layer 26 being transparent on the substrate 12 to provide contrast to show the pillars 20. Section lines XX' and YY' are shown. The cross-sectional view of section X-X' is shown in FIG. 5. The section Y-Y' is depicted in FIG. 7. The pillars 20 are patterned to form a square shape in the pillar array 24 and thus the nanoparticles have x and y dimensions controlled (and in this case equal).

The patterned shapes can have different x and y dimensions to control their shapes (e.g., instead of squares rectangles).

The z direction (into the page) is controlled by the thickness of layers 14. In this way, the size and shapes of the nanoparticles to be formed from the layers 14 are controlled in three dimensions by well-controlled semiconductor processing techniques, e.g., SIT or lithographic patterning and deposition thickness control. In another embodiment, the pillar array 24 can include a plurality of different shapes together for embodiments where a mixture of particles of different shapes and sizes could be useful. The patterning process can also control the ratio of the different types of particles. For example, rectangular shapes to circular shapes may be 5:1 be providing five pillars 20 with rectangular shapes to every pillar having a circular shape, etc. Other ratios and combinations are also contemplated.

Referring to FIG. 7, a cross-sectional view taken at section line Y-Y' of FIG. 6 is illustratively shown. The pillars 20 include the same or similar dimensions as depicted in FIG. 5 since the pillars 20 have a square cross-section (e.g., equal sides in the x and y directions). Layers 14 are surrounded by layers 16 and regions 30. Layers 14 will become nanoparticles 40 (FIG. 8) once released from the pillar structures 20.

Figure 8:
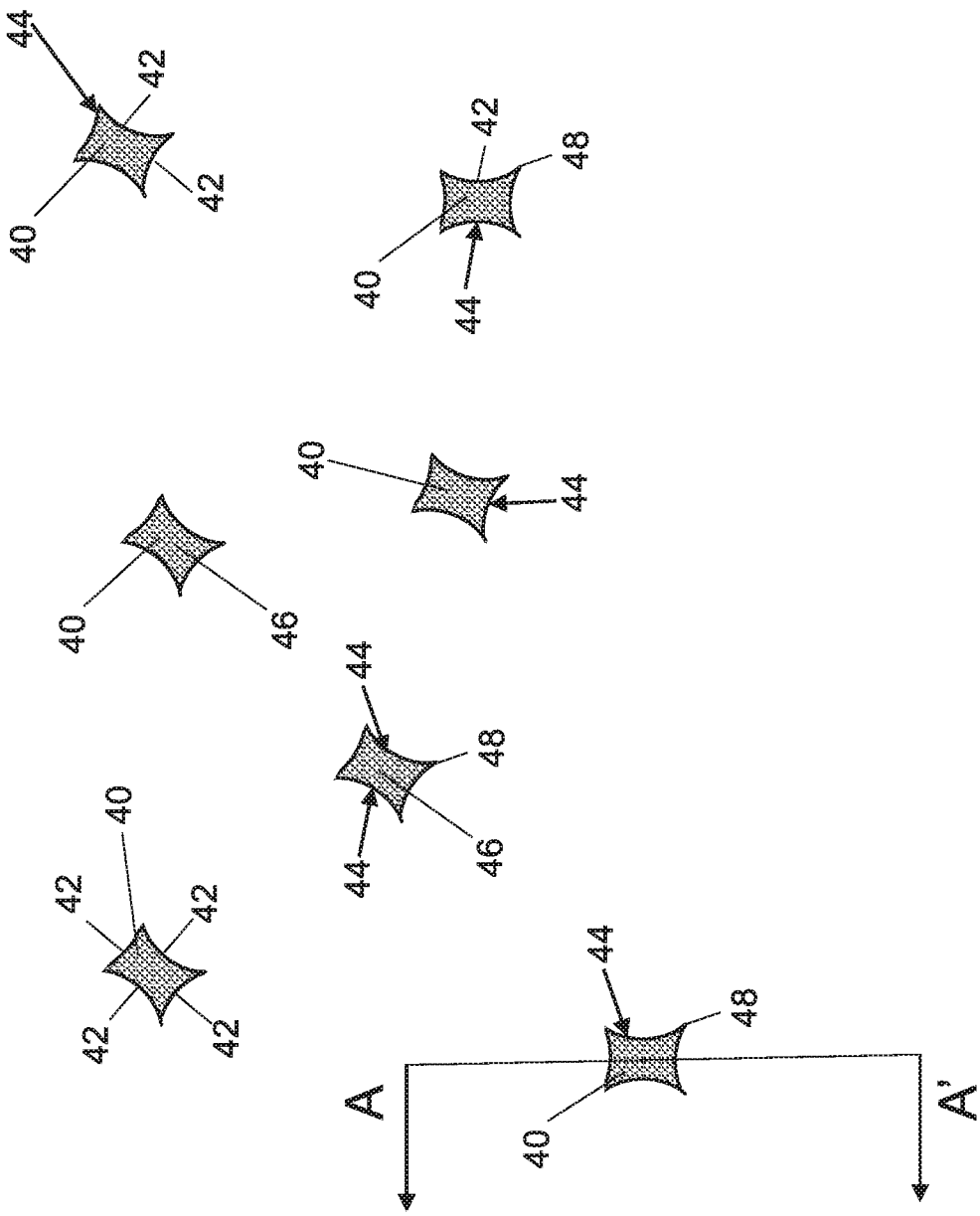
FIG. 8 is a cross-sectional view showing nanoparticles formed by being released from the pillars by a wet etch process in accordance with an embodiment of the present invention.

In one embodiment, layers 16 include Si and the regions 30 include oxide. A selective wet etch can be performed to remove the oxide of regions 30 and the Si of layers 16 (and substrate 12) to release the nanoparticles 40 (FIG. 8). The selective wet etch solution can include, e.g., a wet selective etching using an oxidation agent such as $HNO_3$ or $H_2O_2$ with an etching agent (e.g., HF). The wet etch may be performed in stages by first removing the oxide with a first etch chemistry followed by a release etch using a second etch chemistry. Dry etching may also be employed, e.g., a combination of $CF_4/O_2/N_2$ gases.

Referring to FIG. 8, nanoparticles 40 are illustratively depicted. The nanoparticles 40 include portions of layers 14 after being released by an etch process. In one embodiment, the nanoparticles 40 include a star shape that includes six sides 42. Each side 42 is bowed or curved to a largest depth at its center to form a divot on each side 42. In some embodiments, the nanoparticles 40 are formed with a geometric configuration having a plurality sides (2-8 or more) and a center 46. Each side 42 includes a curved shape forming a divot and forming edges 44 as adjacent sides meet. The edges 44 extend into sharp tips 48 at a furthest distance from the center 46.

The nanoparticles 40 can include an average dimension between about 1 nm to about 100 nm, although other dimensions may be employed. The nanoparticles 40 can be doped, coated or mechanically processed to achieve different dimensions, shapes, or properties.

In one embodiment, heavily-doped star-shaped SiGe nanoparticles can be employed as a potential plasmonic material for Surface Enhanced Raman Scattering (SRES) applications. The sharp tips from these nanoparticles 40 can yield extraordinary field enhancements, and the Raman scattering intensity from the molecules located in the vicinity of the metallic nanoparticle's surface can be excited by light and strongly enhanced. This permits for highly sensitive detection of low concentration analytes/molecules.

Figure 9:
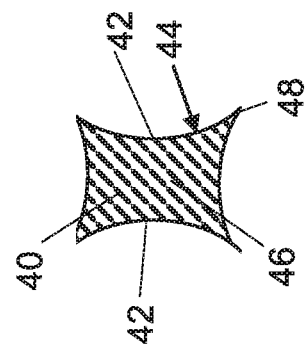
FIG. 9 is a magnified cross-sectional view taken at section line A-A' of FIG. 8 also showing front and back sides of the nanoparticle of FIG. 8 in accordance with an embodiment of the present invention.

Referring to FIG. 9, a nanoparticle 40 is shown in a magnified cross-sectioned view taken at section line A-A' of FIG. 8. In one embodiment, the nanoparticles 40 include a star shape that includes six sides 42. Each side 42 including a front and back side of the nanoparticle 40 is bowed or curved to a largest depth at its center to form a divot on each side 42. Each side 42 includes a curved shape forming a divot and forming edges 44 as adjacent sides meet. The edges 44 extend into sharp tips 48 at a furthest distance from the center 46.

Figure 10:
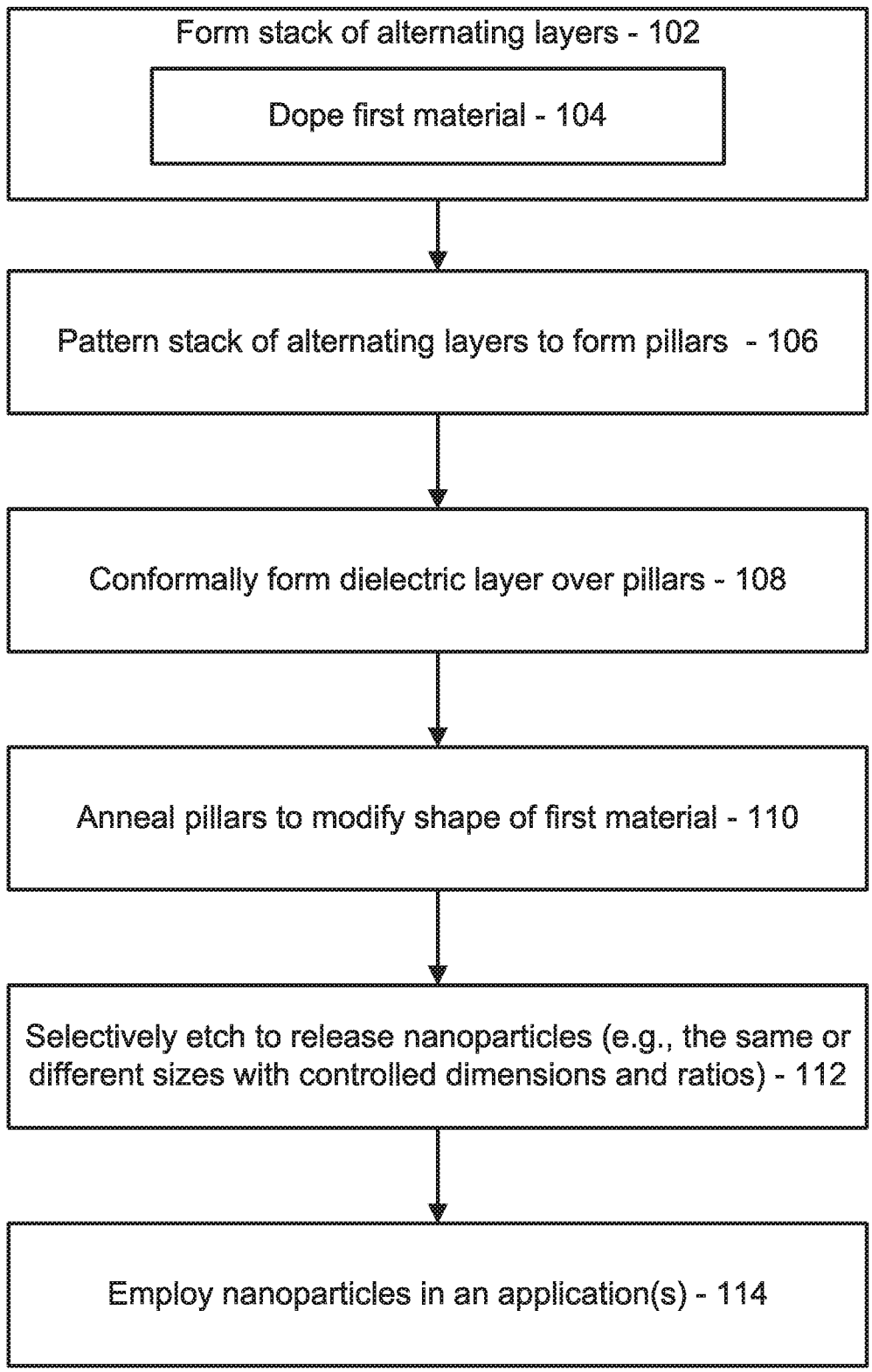
FIG. 10 is a block/flow diagram showing methods for fabricating nanoparticles in accordance with embodiments of the present invention.

Referring to FIG. 10, methods for forming nanoparticles are illustrative shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a stack of alternating layers is formed. The alternating layers include two different materials where a first material is disposed between a second material. The stack can be formed on a semiconductor substrate, and the alternating layers can be epitaxially grown. In one embodiment, the first material includes SiGe and the second material includes Si. In other embodiments, layers may include insulator, semiconductor or metallic materials for forming insulator, semiconductor or metallic nanoparticles.

In block 104, the first material can be doped, e.g., in-situ, although other doping techniques can be employed after the formation of each layer.

In block 106, the stack of alternating layers is patterned to form pillars. The area dimensions can be controlled, which, in turn, can control the size and shape of the nanoparticles to be formed. The patterning of the stack includes control of dimensions of the nanoparticle using a pattern shape and/or a layer thickness of the first material.

In block 108, a dielectric layer is conformally deposited over the pillars. The dielectric layer can include an oxide, e.g., a silicon oxide.

In block 110, the pillars are annealed in an oxygen environment to modify a shape of the first material of the alternating layers. The dimensions of the nanoparticle can be controlled by tuning oxidation conditions (e.g., concentration, temperature, etc.) to oxidize the first material. In useful embodiments, sharp tips are formed in the first material through oxidation and diffusion of Ge.

In block 112, the dielectric layer and the second material are selectively etched with respect to the first material to form nanoparticles from the first material. In one embodiment, the nanoparticles can include a substantially same size and shape as formed in a single batch. In other embodiments, the nanoparticles can be concurrently formed in multiple sizes in a single batch. The multiple sizes can be formed in accordance with a ratio of the different sizes. The nanoparticles can include insulator, semiconductor or metallic materials.

In block 114, the nanoparticles can be employed in many applications including as a light scatter media, biolabeling, etc. The nanoparticles can include a single size (within a tolerance), a range of sizes or multiple sizes (in different ratios). The nanoparticles can also be coated with any number of materials.

Having described preferred embodiments for nanoparticle structures and processes for manufacture (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming nanoparticles, comprising:
patterning a stack of alternating material layers to form pillars, wherein the stack of alternating material layers includes a first material of the alternating layers and a second material of the alternating layers;
depositing a dielectric layer over the pillars;
oxidizing sidewalls of the pillars to modify a shape of the first material of the alternating layers; and
removing the dielectric layer and the second material of the stack of alternating material layers to form nanoparticles from the first material.

2. The method as recited in claim 1, wherein the first material is a germanium-containing semiconductor and the second material is a silicon-containing semiconductor.

3. The method as recited in claim 1, wherein patterning the stack of alternating layers includes an anisotropic etch.

4. The method as recited in claim 1, wherein patterning the stack of alternating layers includes controlling dimensions of the nanoparticle using a layer thickness of the first material.

5. The method as recited in claim 1, wherein oxidizing sidewalls of the pillars comprises annealing the pillars in the oxygen environment.

6. The method as recited in claim 5, wherein said annealing the pillars includes controlling dimensions of the nanoparticle by tuning oxidation conditions to oxidize the first material.

7. The method as recited in claim 1, further comprising doping the first material.

8. The method as recited in claim 1, wherein annealing the pillars in the oxygen environment includes forming sharp tips on the alternating layers of the first material through oxidation and diffusion.

9. The method as recited in claim 1, wherein the nanoparticles include a same size and shape.

10. The method as recited in claim 1, further comprising concurrently forming nanoparticles of a multiple sizes.

11. The method as recited in claim 10, wherein the multiple sizes are formed in accordance with a ratio.

12. A method for forming nanoparticles, comprising:
forming a stack of alternating layers on a substrate including SiGe layers disposed between Si material;
patterning the stack of alternating layers to form pillars having side dimensions;
conformally depositing an oxide layer over the pillars;
thermally annealing the pillars in an oxygen environment to modify a shape of the SiGe layers; and
wet etching the dielectric layer and the Si material selective to the SiGe layers to form SiGe nanoparticles with sidewalls having a concave curvature relative to a center of the nanoparticle and an apex at each intersecting edge for said sidewalls having the concave curvature.

13. The method as recited in claim 12, further comprising doping the SiGe layers.

* * * * *